(12) United States Patent
Umeda et al.

(10) Patent No.: US 9,246,079 B2
(45) Date of Patent: Jan. 26, 2016

(54) PIEZOELECTRIC THIN-FILM RESONATOR AND METHOD FOR PRODUCING PIEZOELECTRIC THIN FILM

(71) Applicant: Murata Manufacturing Co., Ltd., Nagaokakyo-shi, Kyoto-fu (JP)

(72) Inventors: Keiichi Umeda, Nagaokakyo (JP); Takashi Miyake, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 462 days.

(21) Appl. No.: 13/677,347

(22) Filed: Nov. 15, 2012

(65) Prior Publication Data

US 2013/0127300 A1    May 23, 2013

(30) Foreign Application Priority Data

Nov. 18, 2011    (JP) ................ 2011-252915
Aug. 6, 2012    (JP) ................ 2012-174032

(51) Int. Cl.
| | |
|---|---|
| *H01L 41/18* | (2006.01) |
| *H01L 41/316* | (2013.01) |
| *H03H 9/02* | (2006.01) |
| *H03H 9/17* | (2006.01) |
| *H03H 3/04* | (2006.01) |
| *H01L 41/187* | (2006.01) |
| *H03H 3/02* | (2006.01) |

(52) U.S. Cl.
CPC .............. *H01L 41/18* (2013.01); *H01L 41/187* (2013.01); *H01L 41/316* (2013.01); *H03H 3/04* (2013.01); *H03H 9/02015* (2013.01); *H03H 9/02157* (2013.01); *H03H 9/173* (2013.01); *H03H 9/175* (2013.01); *H03H 2003/021* (2013.01); *H03H 2003/025* (2013.01)

(58) Field of Classification Search
CPC ... H01L 41/0926; H01L 41/187; H01L 41/18; H03H 9/24
USPC .................................... 310/321, 358
See application file for complete search history.

(56) References Cited

U.S. PATENT DOCUMENTS

| | | | | |
|---|---|---|---|---|
| 2008/0111452 A1* | 5/2008 | Koizumi | .............. | C01G 29/006 310/324 |
| 2008/0296529 A1* | 12/2008 | Akiyama | .............. | B81B 3/0021 252/62.9 PZ |
| 2012/0107557 A1* | 5/2012 | Akiyama | ............ | C23C 14/0617 428/141 |

FOREIGN PATENT DOCUMENTS

| | | |
|---|---|---|
| JP | 59-193272 A | 11/1984 |
| JP | 64-42576 A | 2/1989 |

(Continued)

OTHER PUBLICATIONS

EPO Translation of JP 2009-010926, Morihito.*

(Continued)

*Primary Examiner* — Shawki S Ismail
*Assistant Examiner* — Bryan Gordon
(74) *Attorney, Agent, or Firm* — Keating & Bennett, LLP

(57) ABSTRACT

A piezoelectric thin-film resonator includes a piezoelectric thin film which includes aluminum nitride containing Sc and which has a concentration distribution such that the concentration of Sc is non-uniform in a thickness direction of the piezoelectric thin film; a first electrode; a second electrode facing the first electrode across the piezoelectric thin film; and a substrate supporting a piezoelectric vibrating section defined by the piezoelectric thin film and the first and second electrodes.

10 Claims, 15 Drawing Sheets

(56) References Cited

FOREIGN PATENT DOCUMENTS

| | | |
|---|---|---|
| JP | 2001-211053 A | 8/2001 |
| JP | 2009-10926 A | 1/2009 |
| JP | 2011-015148 A | 1/2011 |

OTHER PUBLICATIONS

EPO Translation of JP 2001-211053, Hidekazu.*
Official Communication issued in corresponding Japanese Patent Application No. 2012-174032, mailed on Nov. 25, 2014.

* cited by examiner

6D

PIEZOELECTRIC THIN-FILM RESONATOR AND METHOD FOR PRODUCING PIEZOELECTRIC THIN FILM

BACKGROUND OF THE INVENTION

1. Field of the Invention

The present invention relates to piezoelectric thin-film resonators including an aluminum nitride material and particularly relates to a piezoelectric thin-film resonator including an Sc-containing aluminum nitride layer.

2. Description of the Related Art

Various piezoelectric thin-film resonators including piezoelectric thin films have been proposed. Japanese Unexamined Patent Application Publication No. 2011-15148 discloses a method for producing a piezoelectric thin film for use in such a piezoelectric thin-film resonator. That is, Japanese Unexamined Patent Application Publication No. 2011-15148 discloses a technique in which aluminum and scandium are sputtered at a substrate temperature of about 5° C. to 450° C. in a nitrogen atmosphere. This allows the content of scandium in an aluminum nitride thin film containing scandium to be about 0.5 atomic percent to 50 atomic percent, leading to an increase in piezoelectric response. Japanese Unexamined Patent Application Publication No. 2011-15148 describes that the content of scandium in the scandium-containing aluminum nitride thin film is about 0.5 atomic percent to 50 atomic percent as described above, preferably about 35 atomic percent to 43 atomic percent, and most preferably about 43 atomic percent.

However, in the case of fabricating a piezoelectric thin-film resonator using an Sc-containing aluminum nitride thin film having an Sc content described in Japanese Unexamined Patent Application Publication No. 2011-15148, there is a problem in that the absolute value of the temperature coefficient of frequency TCF of the piezoelectric thin film is large. Therefore, it has not been possible to obtain a piezoelectric thin-film device which has a sufficient fractional bandwidth and in which the absolute value of the temperature coefficient of frequency TCF is small.

In a piezoelectric thin-film resonator including the Sc-containing aluminum nitride thin film disclosed in Japanese Unexamined Patent Application Publication No. 2011-15148, properties according to the concentration of Sc can be obtained; however, it is difficult to vary the properties thereof. That is, the degree of freedom in designing various properties such as fractional bandwidth and frequency-temperature properties is low.

SUMMARY OF THE INVENTION

Accordingly, preferred embodiments of the present invention provide a piezoelectric thin-film resonator which includes an aluminum nitride thin film containing Sc, in which the design scope of fractional bandwidth and frequency-temperature properties can be expanded, and which significantly increases the degree of freedom in design.

A piezoelectric thin-film resonator according to a preferred embodiment of the present invention includes a piezoelectric thin film which includes aluminum nitride containing Sc and which has a concentration distribution such that the concentration of Sc is non-uniform in a thickness direction of the piezoelectric thin film; a first electrode; a second electrode facing the first electrode across the piezoelectric thin film; and a substrate supporting a piezoelectric vibrating section defined by the piezoelectric thin film and the first and second electrodes.

In another preferred embodiment of the piezoelectric thin-film resonator, the piezoelectric thin film is a multilayer film including a plurality of stacked layers having different Sc concentrations. In this case, since the layers have different Sc concentrations, a concentration distribution such that the concentration of Sc in the piezoelectric thin film is non-uniform in a thickness direction thereof can be readily provided.

In another preferred embodiment of the piezoelectric thin-film resonator, the layers include an Sc-free aluminum nitride layer and an Sc-containing aluminum nitride layer. The layers may include such an Sc-free aluminum nitride layer. This allows the diversity in distribution of the concentration of Sc to be increased.

In another preferred embodiment of the piezoelectric thin-film resonator, the concentration of Sc in the piezoelectric thin film varies continuously in a thickness direction thereof. In this case, the crystal structure is likely to be continuous. This allows the piezoelectric thin film to have good crystallinity, low piezoelectric deterioration, and low elastic loss.

In another preferred embodiment of the piezoelectric thin-film resonator, the piezoelectric thin film includes side portions which are each in contact with a corresponding one of the first and second electrodes and an approximate center of the piezoelectric thin film in a thickness direction thereof has an Sc concentration higher than that of the side portions. The higher the concentration of Sc in the piezoelectric thin film, the higher the electromechanical coefficient thereof is and the higher the dielectric loss thereof is. The stress of a thickness longitudinal vibration concentrates on an approximate center of the piezoelectric thin film in a thickness direction thereof that has a high Sc concentration. That is, energy concentrates on a portion having a large electromechanical coefficient and a large dielectric loss. This allows the fractional bandwidth to be efficiently increased. On the other hand, the side portions in contact with the first and second electrodes have a low Sc concentration; hence, the dielectric loss of the piezoelectric thin-film resonator can be efficiently reduced on the whole.

In another preferred embodiment of the piezoelectric thin-film resonator, the first electrode serves as a lower electrode, the second electrode serves as an upper electrode, and the piezoelectric thin film includes a surface portion which is in contact with the upper electrode and which is made of aluminum nitride containing no Sc. In this case, aluminum nitride, which is excellent in crystallinity, is present in the upper surface of the piezoelectric thin film. This allows the upper electrode to have enhanced crystallinity. Thus, in the case of applying high electric power to a filter including the piezoelectric thin-film resonator, the occurrence of failures due to stress migration or electromigration is significantly reduced and prevented.

In another preferred embodiment of the piezoelectric thin-film resonator, the piezoelectric thin film includes side portions which are each in contact with a corresponding one of the first and second electrodes and the approximate center of the piezoelectric thin film in the thickness direction thereof has an Sc concentration lower than that of the side portions. An Sc-containing aluminum nitride layer is more unlikely to be etched by an alkaline solution than an aluminum nitride layer. That is, the higher the Sc concentration of the Sc-containing aluminum nitride layer is, the higher the etching resistance thereof to an alkaline solution such as an alkaline developer typified by tetramethylammonium hydroxide (TMAH) is. When the approximate center of the piezoelectric thin film in the thickness direction thereof has a low Sc concentration, the side portions in contact with the first and second electrodes have a high Sc concentration and therefore have high etching resistance to such an alkaline solution.

Thus, in the case where a resist pattern is formed on the piezoelectric thin film by photolithography including alkali developing and a lift-off process in which an electrode material is formed into a film by vapor deposition is used, a surface portion of the piezoelectric thin film is unlikely to be dissolved in an alkali developer. That is, a lift-off resist pattern can be formed on the Sc-containing aluminum nitride layer by ordinary alkali developing.

In another preferred embodiment of the piezoelectric thin-film resonator, one of the layers that is in contact with the first electrode and one of the layers that is in contact with the second electrode may be Sc-containing aluminum nitride layers and one of the layers that is located at the approximate center of the piezoelectric thin film in the thickness direction thereof may be an Sc-free aluminum nitride layer such that the thicknesswise center of the piezoelectric thin film has a low Sc concentration.

In another preferred embodiment of the piezoelectric thin-film resonator, the concentration of Sc in the piezoelectric thin film preferably ranges from about 0.5 atomic percent to about 24 atomic percent, for example. In this case, both a sufficient fractional bandwidth and good frequency-temperature properties are more reliably ensured.

Another preferred embodiment of the present invention provides a method for producing a piezoelectric thin film that includes forming an Sc-containing aluminum nitride layer by a two-target sputtering process using a first target made of Al and a second target made of ScN such that the Sc-containing aluminum nitride layer has a concentration distribution such that the concentration of Sc is non-uniform in a thickness direction thereof.

Another preferred embodiment of the present invention provides a method for producing a piezoelectric thin film that includes forming an Sc-containing aluminum nitride layer in an atmosphere containing at least a nitrogen gas by a sputtering process using a composite target including an Al target body having a plurality of recessed portions in a surface thereof and Sc target portions located in the recessed portions such that the Sc-containing aluminum nitride layer has a concentration distribution such that the concentration of Sc is non-uniform in a thickness direction thereof. In an example of this method, a perforation or a through-hole may be provided in the Al target body and may be filled with Sc.

In a piezoelectric thin-film resonator according to a preferred embodiment of the present invention, a piezoelectric thin film includes aluminum nitride containing Sc and has a concentration distribution such that the concentration of Sc is non-uniform in a thickness direction thereof. Therefore, the adjustment of the concentration of Sc allows the piezoelectric thin-film resonator to have a high degree of freedom in designing various properties such as fractional bandwidth and frequency-temperature properties.

In a preferred embodiment of a method for producing a piezoelectric thin film according to the present invention, a piezoelectric thin film including an Sc-containing aluminum nitride layer can be obtained by a two-target sputtering process using a first target made of Al and a second target made of ScN. The Sc-containing aluminum nitride layer has a concentration distribution such that the concentration of Sc is non-uniform in a thickness direction thereof. Therefore, the piezoelectric thin-film resonators according to the above-described preferred embodiments of the present invention are obtained using the thin-films obtained according to a preferred embodiment of a production method of the present invention.

In another preferred embodiment of a method for producing a piezoelectric thin film according to the present invention, a piezoelectric thin film including an Sc-containing aluminum nitride layer can be obtained using a composite target. The Sc-containing aluminum nitride layer has a concentration distribution such that the concentration of Sc is non-uniform in a thickness direction thereof. Therefore, the piezoelectric thin-film resonators according to various preferred embodiments of the present invention are obtained using the thin-films obtained according to a production method of other preferred embodiments of the present invention.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will now be described with reference to the accompanying drawings.

First Preferred Embodiment

Figure 1A:
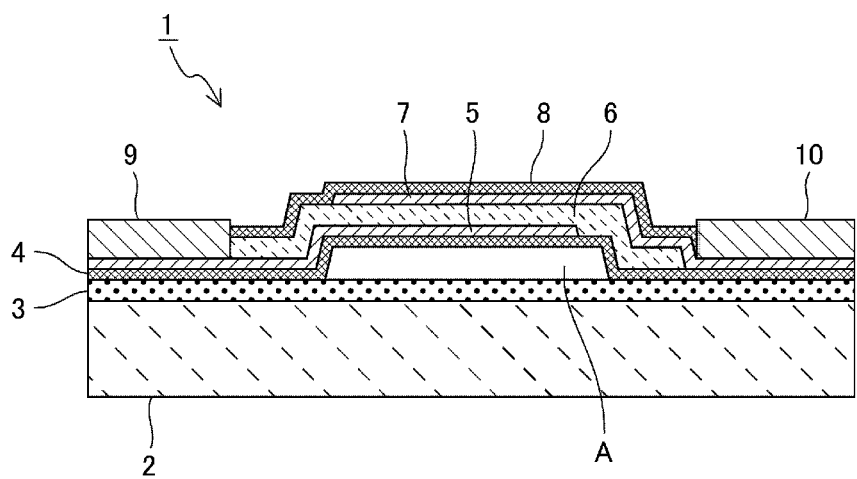
FIG. 1A is a front sectional view of a piezoelectric thin-film resonator according to a first preferred embodiment of the present invention.

FIG. 1A is a front sectional view of a piezoelectric thin-film resonator 1 according to a first preferred embodiment of the present invention.

The piezoelectric thin-film resonator 1 includes a substrate 2. The substrate 2 may be made of an appropriate material such as high-resistance silicon, glass, or GaAs, for example. In the present preferred embodiment, the substrate 2 is preferably made of Si, for example.

The substrate 2 is overlaid with an insulating film 3. The insulating film 3, which need not necessarily be used, is used in a step of forming a cavity A described below and therefore is preferably placed thereon. In the present preferred embodiment, the insulating film 3 is preferably made of silicon oxide.

The insulating film 3 is overlaid with a first protective film 4 to protect a resonator portion. The first protective film 4 is preferably made of silicon oxide, for example. The first protective film 4 includes a central portion that is separated from the substrate 2 and the insulating film 3 with the cavity A therebetween.

The first protective film 4 is overlaid with a first electrode 5 serving as a lower electrode. The first electrode 5 is overlaid with a piezoelectric thin film 6 including aluminum nitride containing Sc. The piezoelectric thin film 6 is overlaid with a second electrode 7 serving as an upper electrode.

Figure 1B:
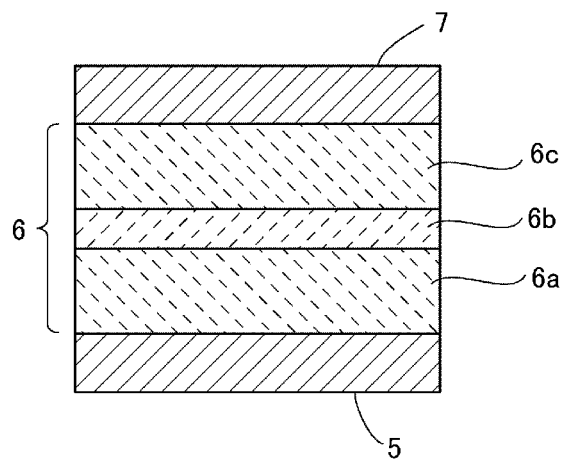
FIG. 1B is an enlarged front sectional view of a principal portion of a region in which a piezoelectric thin film, a first electrode, and a second electrode included in the piezoelectric thin-film resonator according to the first preferred embodiment of the present invention are stacked.

In the present preferred embodiment, the piezoelectric thin film 6 includes aluminum nitride containing Sc and has a concentration distribution such that the concentration of Sc is non-uniform, or discontinuous in a thickness direction thereof. In particular, as shown in FIG. 1B in an enlarged scale, the piezoelectric thin film 6 has a structure in which a first aluminum nitride layer 6a, an Sc-containing aluminum nitride layer 6b, and a second aluminum nitride layer 6c are stacked in that order. In other words, the first aluminum nitride layer 6a is located on the first electrode 5 side and the second aluminum nitride layer 6c is located on the second electrode 7. The Sc-containing aluminum nitride layer 6b is located at an approximate center of the piezoelectric thin film 6 in a thickness direction thereof. This allows the approximate center of the piezoelectric thin film 6 in the thickness direction thereof to have a relatively high Sc concentration and portions of the piezoelectric thin film 6 that are each located on a corresponding one of the first electrode 5 side and the second electrode 7 side to have a relatively low Sc concentration.

The first aluminum nitride layer 6a, the Sc-containing aluminum nitride layer 6b, and the second aluminum nitride layer 6c can be formed by a thin-film forming method, for example. Examples of the thin-film forming method include sputtering and chemical vapor deposition (CVD). In the present preferred embodiment, the first aluminum nitride layer 6a, the Sc-containing aluminum nitride layer 6b, and the second aluminum nitride layer 6c are preferably formed by sputtering, for example.

In the present preferred embodiment, the first aluminum nitride layer 6a, the Sc-containing aluminum nitride layer 6b, and the second aluminum nitride layer 6c are stacked as described above. This allows the concentration of Sc to be distributed in a thickness direction of the piezoelectric thin film 6. In this preferred embodiment, the Sc concentration of the piezoelectric thin film 6 preferably ranges from about 0.5 atomic percent to about 24 atomic percent, for example, on the basis that the sum of the number of Sc and the number of aluminum in the piezoelectric thin film 6 is about 100 atomic percent, for example. This allows a sufficient fractional bandwidth and good frequency-temperature properties to be ensured.

The second electrode 7 is located on the piezoelectric thin film 6. Above the cavity A, the first electrode 5 and the second electrode 7 face each other across the piezoelectric thin film 6. Portions of the first and second electrodes 5 and 7 that face each other define a piezoelectric vibrating section. That is, when an alternating-current voltage is applied to the piezoelectric vibrating section, a bulk wave is generated from the piezoelectric vibrating section by a piezoelectric effect.

The first electrode 5 and the second electrode 7 are made of an appropriate conductive material. Examples of such a conductive material include metals such as Pt, Au, Ti, Mo, W, Ru, Ir, Al, Cu, Cr, and Sc and alloys of these metals. The first electrode 5 and the second electrode 7 may include a multi-layer metal film including a plurality of stacked metal layers.

The second electrode 7 is covered with a second protective film 8. The second protective film 8 is preferably made of an appropriate insulating material capable of protecting the second electrode 7 and the piezoelectric thin film 6 from outside. Examples of such an insulating material include silicon oxide, silicon oxynitride, and silicon nitride. In the present preferred embodiment, the second protective film 8 is preferably made of silicon oxide, for example.

In a region around the piezoelectric vibrating section, that is, in a region outside the cavity A, the first protective film 4 is in contact with the insulating film 3. Therefore, the height of other layers stacked on the first protective film 4 is less than the piezoelectric vibrating section.

The first electrode 5 is connected to a first electrode pad 9 located outside a region containing the cavity A. Likewise, the second electrode 7 is connected to a second electrode pad 10 located outside the region containing the cavity A.

In the piezoelectric thin-film resonator 1, a bulk wave propagating in the piezoelectric thin film 6 is excited by applying an alternating-current electric field between the first and second electrodes 5 and 7. Resonant properties can be obtained by making use of a resonant phenomenon due to the fundamental of the bulk wave.

In the piezoelectric thin-film resonator 1, the piezoelectric thin film 6 includes aluminum nitride containing Sc and has a concentration distribution such that the concentration of Sc is non-uniform in a thickness direction of the piezoelectric thin film 6. Therefore, various properties such as fractional bandwidth and frequency-temperature properties can be readily controlled by adjusting the concentration distribution of Sc.

The dielectric loss of aluminum nitride is less than that of Sc-containing aluminum nitride. The electromechanical coefficient of the Sc-containing aluminum nitride layer 6b is greater than that of the first and second aluminum nitride layers 6a and 6c. The strain energy of the thickness longitudinal vibration of the piezoelectric thin-film resonator 1 concentrates on the approximate center of the piezoelectric thin film 6 in the thickness direction thereof. Thus, in the present preferred embodiment, the Sc-containing aluminum nitride layer 6b, which has a large electromechanical coefficient and a large dielectric loss, is located at the approximate center in the thickness direction thereof on which the strain energy concentrates. This allows the fractional bandwidth of the piezoelectric thin-film resonator 1 to be efficiently increased.

In addition, the first and second aluminum nitride layers 6a and 6c, which have a small electromechanical coefficient and a small dielectric loss, are arranged on both sides of the Sc-containing aluminum nitride layer 6b. This allows the dielectric loss of the piezoelectric thin film 6 to be reduced.

In the present preferred embodiment, the Sc concentration of the piezoelectric thin film 6 ranges from about 0.5 atomic percent to about 24 atomic percent, for example, as described above. This allows a sufficient fractional bandwidth to be ensured and also allows the absolute value of the temperature coefficient of frequency TCF to be small. This is described with reference to FIG. 2.

Japanese Unexamined Patent Application Publication No. 2011-15148 describes that, in order to obtain good piezoelectric response using the Sc-containing aluminum nitride film, the Sc content thereof needs to range from 0.5 atomic percent to 50 atomic percent. However, as a result of various investigations, the present inventors have discovered that even if the Sc content is within the above range, it is substantially impossible that the fractional bandwidth of a resonator is sufficiently large, the absolute value of the temperature coefficient of frequency TCF is substantially small, and the dielectric loss is reduced such that the insertion loss is sufficiently small. As a result of further investigations, the inventors have discovered that when the content of Sc ranges from about 0.5 atomic percent to about 24 atomic percent, for example, a sufficient fractional bandwidth can be ensured and frequency-temperature properties can be improved.

Figure 2:
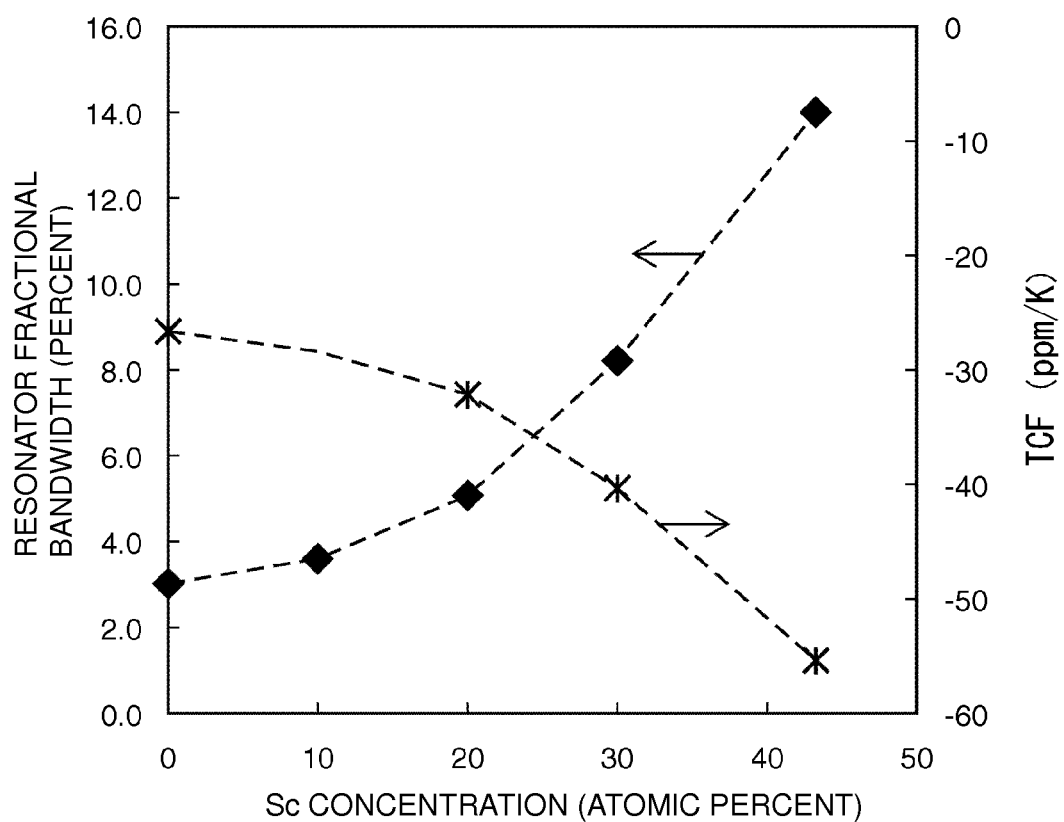
FIG. 2 is a graph showing correlations between the Sc concentration of the piezoelectric thin film, the fractional bandwidth of the piezoelectric thin-film resonator according to the first preferred embodiment of the present invention, and the temperature coefficient of frequency TCF of the piezoelectric thin-film resonator according to the first preferred embodiment of the present invention.

FIG. 2 shows correlations between the Sc concentration of the piezoelectric thin film 6, the fractional bandwidth of the piezoelectric thin-film resonator 1, and the temperature coefficient of frequency TCF of the piezoelectric thin-film resonator 1. As is clear from FIG. 2, the resonator fractional bandwidth increases with the increase of the Sc concentration.

In contrast, the temperature coefficient of frequency TCF decreases with the increase of the Sc concentration.

Thus, when the Sc concentration is high, the size of the resonator fractional bandwidth and an improvement in temperature coefficient of frequency are in a trade-off relationship.

The temperature coefficient of frequency TCF decreases with the increase of the Sc concentration. In particular, when the Sc concentration ranges from about 0.5 atomic percent to about 24 atomic percent, for example, the temperature coefficient of frequency TCF decreases gradually. As is clear from FIG. 2, the absolute value of the temperature coefficient of frequency TCF increases sharply when the Sc concentration exceeds about 24 atomic percent.

On the other hand, when the piezoelectric thin-film resonator 1 has a fractional bandwidth of several percent, the piezoelectric thin-film resonator 1 is sufficient for use in filters and duplexers used in wireless communication devices such as mobile phones. That is, a fractional bandwidth of about 3% to about 7%, for example, is sufficient. Thus, FIG. 2 shows that when the Sc concentration ranges from about 0.5 atomic percent to about 24 atomic percent, for example, a sufficient fractional bandwidth can be ensured and the absolute value of the temperature coefficient of frequency TCF can be sufficiently reduced. In addition, when the Sc concentration ranges from about 0.5 atomic percent to about 24 atomic percent, for example, the rate of change in the resonator fractional bandwidth and the rate of change in the temperature coefficient of frequency TCF are small. Therefore, if the Sc concentration varies slightly for process reasons, the fractional bandwidth and the temperature coefficient of frequency TCF are unlikely to vary. Thus, the piezoelectric thin-film resonator 1 can be reliably obtained so as to have desired properties.

The piezoelectric thin-film resonator 1 can be fabricated by a method similar to that used to fabricate a known piezoelectric thin-film resonator having the cavity A. An example of the method is described below.

The insulating film 3 is formed on the substrate 2 preferably by a thin-film forming method. A sacrificial layer made of a material such as silicon oxide, zinc oxide, polysilicon, or polyimide is provided on a region where the cavity A is to be formed.

After the sacrificial layer is formed, the first protective film 4 is formed. The first electrode 5 is formed by photolithography. Thereafter, the piezoelectric thin film 6 is formed by a thin-film forming method. The second electrode 7 is formed by photolithography. The second protective film 8 and the first and second electrode pads 9 and 10 are formed. The sacrificial layer is then removed by etching. Alternatively, the sacrificial layer is removed prior to the formation of the first and second electrode pads 9 and 10.

Upon the formation of the piezoelectric thin film 6, the Sc-containing aluminum nitride layer 6b can be formed by a sputtering process using two types of targets described below.

Figure 3:
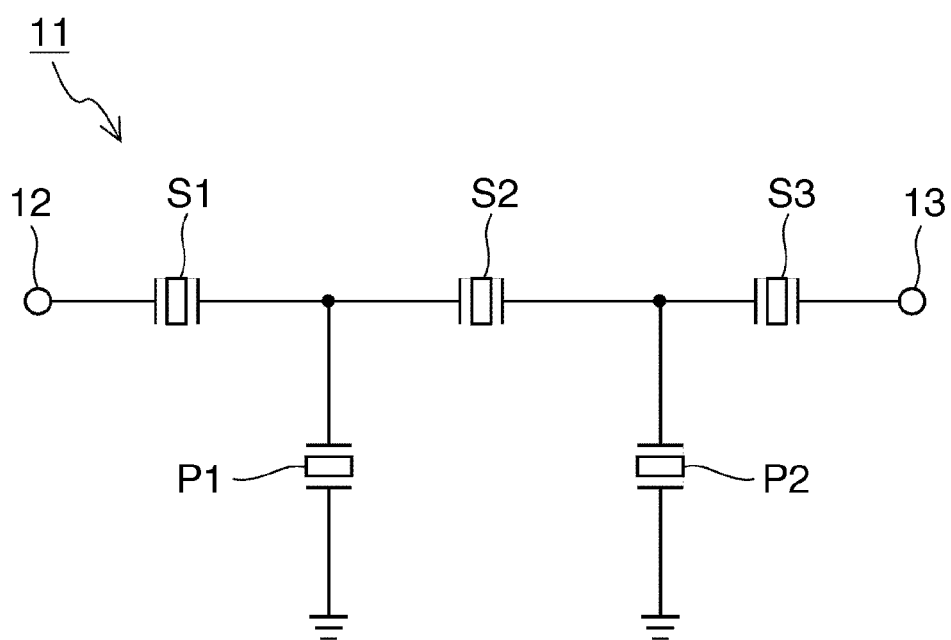
FIG. 3 is a circuit diagram of a piezoelectric filter including the piezoelectric thin-film resonator according to the first preferred embodiment of the present invention.

The piezoelectric thin-film resonator 1 can be used for piezoelectric resonators and various filter devices. FIG. 3 is a circuit diagram of a piezoelectric filter device 11 using the piezoelectric thin-film resonator 1. The piezoelectric filter device 11 includes an input terminal 12, an output terminal 13, and a series arm connecting the input terminal 12 to the output terminal 13. The series arm includes series arm resonators S1 to S3. The series arm resonators S1 to S3 are connected in series to each other. The piezoelectric filter device 11 further includes a first parallel arm and second parallel arm connecting the series arm to the ground potential. The first parallel arm connects a junction between the series arm resonators S1 and S2 to the ground potential. The first parallel arm includes a first parallel arm resonator P1. One end of the second parallel arm is connected to a junction between the series arm resonators S2 and S3 and the other end is connected to the ground potential. The second parallel arm includes a second parallel arm resonator P2.

The series arm resonators S1 to S3 and the first and second parallel arm resonators P1 and P2 define a ladder-type filter.

In the present preferred embodiment, the first and second parallel arm resonators P1 and P2 preferably have substantially the same configuration as that of the piezoelectric thin-film resonator 1. The series arm resonators S1 to S3 each include a second piezoelectric thin-film resonator preferably having substantially the same configuration as that of the piezoelectric thin-film resonator 1 except that the second piezoelectric thin-film resonator includes an Sc-free aluminum nitride film defining a piezoelectric thin film.

Figure 4:
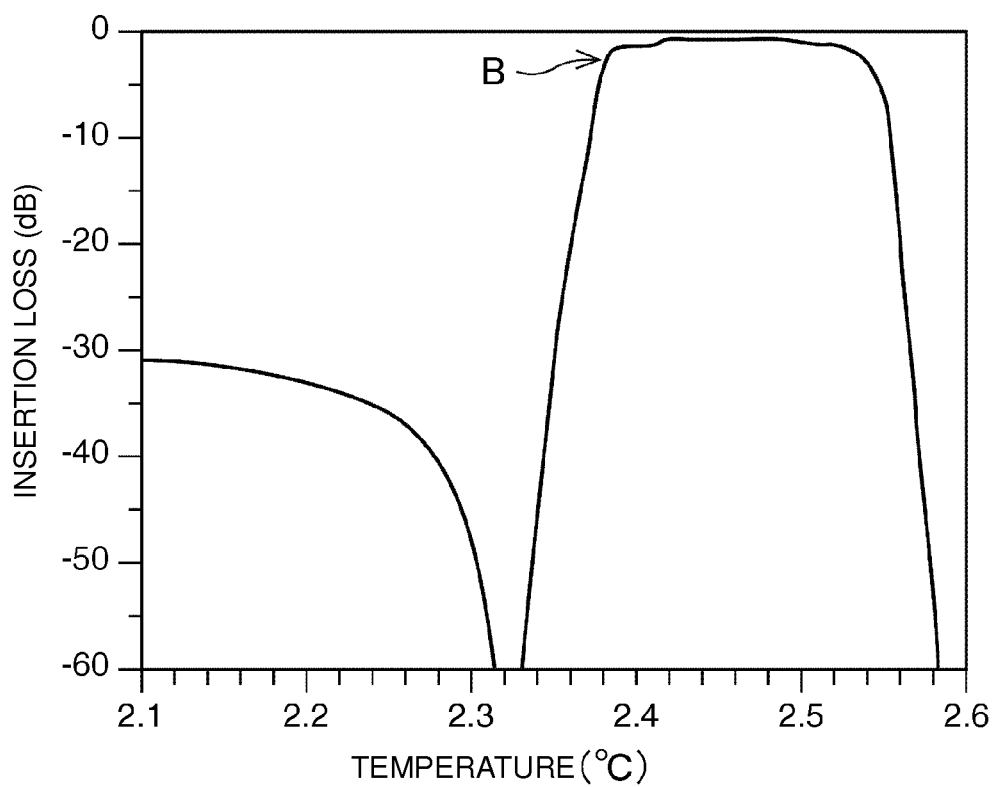
FIG. 4 is a graph showing the attenuation frequency characteristic of the piezoelectric filter shown in FIG. 3.

FIG. 4 shows the attenuation frequency characteristic of the piezoelectric filter device 11. In the ladder-type filter, the resonant frequency of the first and second parallel arm resonators P1 and P2 affects attenuation characteristics of the low frequency-side end of the passband. Thus, in this preferred embodiment, the frequency position of a shoulder on the low frequency side of the passband depends on the resonant frequency of the first and second parallel arm resonators P1 and P2, the shoulder being indicated by Arrow B in FIG. 4. The first and second parallel arm resonators P1 and P2 include a piezoelectric thin film having a concentration distribution such that the concentration of Sc is non-uniform in a thickness direction thereof. Therefore, the resonant frequency of the first and second parallel arm resonators P1 and P2 vary more significantly due to a change in temperature as compared to that of the series arm resonators S1 to S3. Since the first and second parallel arm resonators P1 and P2 preferably have substantially the same configuration as that of the piezoelectric thin-film resonator 1, the frequency position of a shoulder on the low frequency side of the passband can be adjusted, the bandwidth can be increased, and temperature properties can be adjusted.

In contrast to the present preferred embodiment, when the series arm resonators S1 to S3 preferably have substantially the same configuration as that of the piezoelectric thin-film resonator 1 and the first and second parallel arm resonators P1 and P2 are piezoelectric thin-film resonators including an Sc-free aluminum nitride film, the frequency position of a shoulder on the high frequency side of the passband can be adjusted by adjusting the content of Sc and frequency-temperature properties can be also adjusted by adjusting the content of Sc.

In a filter device including a plurality of piezoelectric thin-film resonators, when at least one of the piezoelectric thin-film resonators is the piezoelectric thin-film resonator 1 according to the present preferred embodiment and the other piezoelectric thin-film resonators are second piezoelectric thin-film resonators including an Sc-free aluminum nitride film, the bandwidth can be adjusted or increased or frequency-temperature properties can be improved.

In the present preferred embodiment, the piezoelectric thin film 6 includes the first and second aluminum nitride layers 6a and 6c and the Sc-containing aluminum nitride layer 6b, which is preferably located at the approximate center in the thickness direction thereof. In the piezoelectric thin-film resonator 1, the piezoelectric thin film 6 is not limited to one having a structure in which a plurality of stacked layers.

Second Preferred Embodiment

Figure 5:
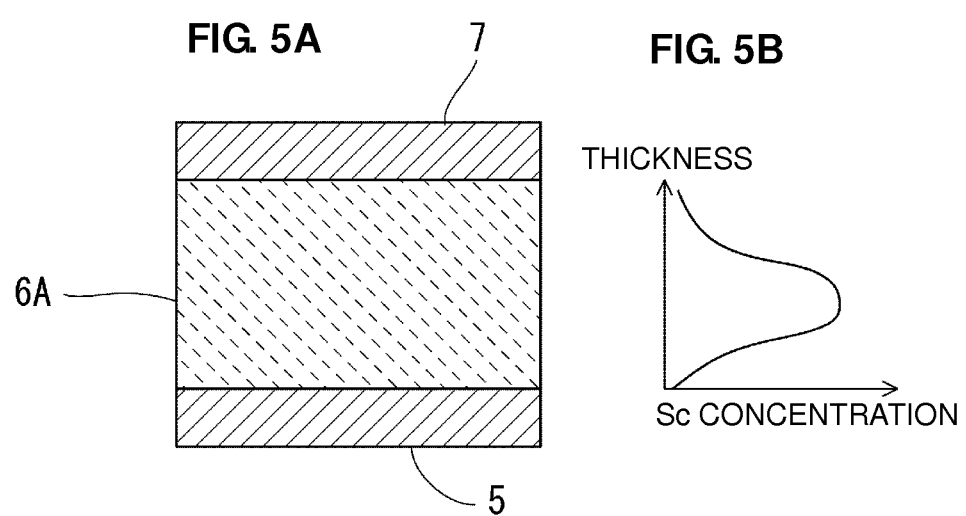
FIG. 5A is an enlarged front sectional view of a principal portion of a region in which a piezoelectric thin film, a first electrode, and a second electrode included in a piezoelectric thin-film resonator according to a second preferred embodiment of the present invention are stacked.
FIG. 5B is a graph illustrating the concentration distribution of Sc in a thickness direction of the piezoelectric thin film of the piezoelectric thin-film resonator according to the second preferred embodiment of the present invention.

FIG. 5A is an enlarged front sectional view of a principal portion of a region in which a piezoelectric thin film 6A, a first electrode 5, and a second electrode 7 included in a piezoelectric thin-film resonator according to a second preferred embodiment of the present invention are stacked. FIG. 5B is a graph illustrating the concentration distribution of Sc in a thickness direction of the piezoelectric thin film.

With reference to FIG. 5A, the first electrode 5 and the second electrode 7 face each other across the piezoelectric thin film 6A. Other components used in this preferred embodiment preferably are substantially the same as those described in the first preferred embodiment. Therefore, descriptions made with reference to FIG. 1A are incorporated herein and these components will not be described.

The piezoelectric thin-film resonator includes a piezoelectric thin film 6A that is made of aluminum nitride containing Sc and the concentration of Sc therein is distributed as shown in FIG. 5B. That is, the concentration of Sc in the piezoelectric thin film 6A varies continuously such that the concentration of Sc therein peaks at an approximate center of the piezoelectric thin film 6A in a thickness direction thereof and decreases toward the first electrode 5 or the second electrode 7. In the piezoelectric thin-film resonator, the concentration of Sc in the piezoelectric thin film 6A may vary continuously at the approximate center of the piezoelectric thin film 6A in the thickness direction thereof.

In the present preferred embodiment, the concentration of Sc in the piezoelectric thin film 6A peaks at the approximate center in the thickness direction thereof and therefore a region having a high Sc concentration is located at the approximate center in the thickness direction thereof on which the strain energy of a thickness longitudinal vibration concentrates, as described in the first preferred embodiment. That is, an aluminum nitride region having a high Sc concentration, having a large electromechanical coefficient and a large dielectric loss is preferably located in an area on which the strain energy concentrates. This allows the fractional bandwidth of the piezoelectric thin-film resonator to be efficiently increased. The concentration of Sc in a portion close to the first electrode 5 or the second electrode 7 is relatively low. Hence, this portion has a small electromechanical coefficient and a small dielectric loss. This allows the dielectric loss of the whole piezoelectric thin film 6A to be reduced.

Figure 6:
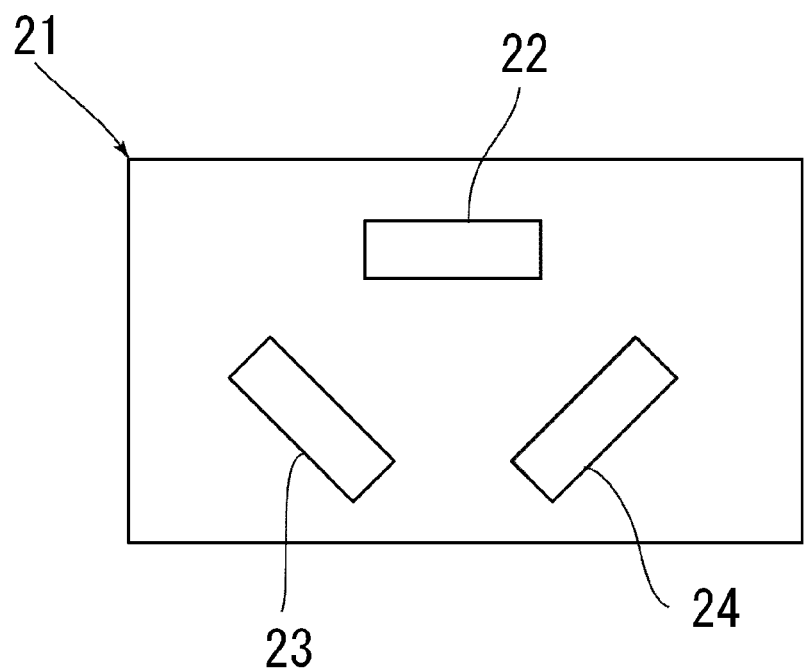
FIG. 6 is a schematic view illustrating an example of a method for forming an Sc-containing aluminum nitride layer included in a piezoelectric thin-film resonator according to a preferred embodiment of the present invention.

The piezoelectric thin film 6A, in which the concentration of Sc varies continuously as described above, can be formed by an appropriate method and is preferably formed using a sputtering system 21 shown in FIG. 6. In the sputtering system 21, an element 22 having no piezoelectric thin film 6A is subjected to sputtering in a nitrogen atmosphere using a first target 23 made of Al and a second target 24 made of Sc. That is, the piezoelectric thin film 6A is preferably formed by a two-target sputtering process, for example. In this case, the above concentration distribution can be achieved by temporally varying sputtering conditions. Alternatively, a first target made of Al and a second target made of ScN may be used in the two-target sputtering process. In this case, the concentration of oxygen, which acts as an impurity, contained in an Sc-containing aluminum nitride film is reduced and therefore the Sc-containing aluminum nitride film can be stably and reliably formed so as to have a high piezoelectric constant.

In the first preferred embodiment, the first and second aluminum nitride layers 6a and 6c may preferably be formed by sputtering using an Al target. The Sc-containing aluminum nitride layer 6b may be formed by the two-target sputtering process as shown in FIG. 6 or a single-target sputtering process using an Sc—Al alloy target. However, the Sc—Al alloy target is very hard and is poor in workability. Therefore, the two-target sputtering process is preferably used. In a simple way, an Sc pellet placed on an Al target may be sputtered.

Figure 14A:
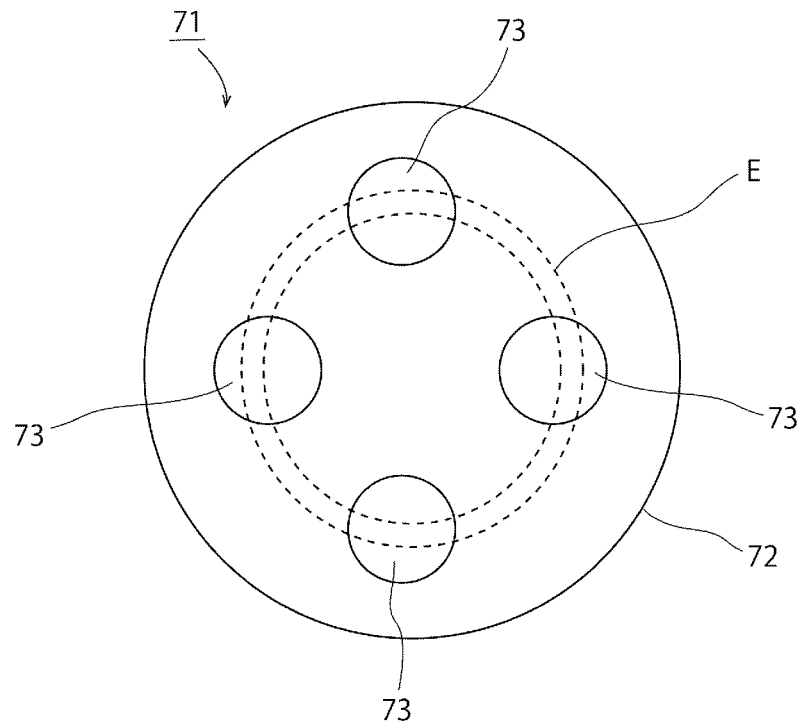
FIG. 14A is a plan view of a composite target used in a method for producing a piezoelectric thin film according to a preferred embodiment of the present invention.
Figure 14B:
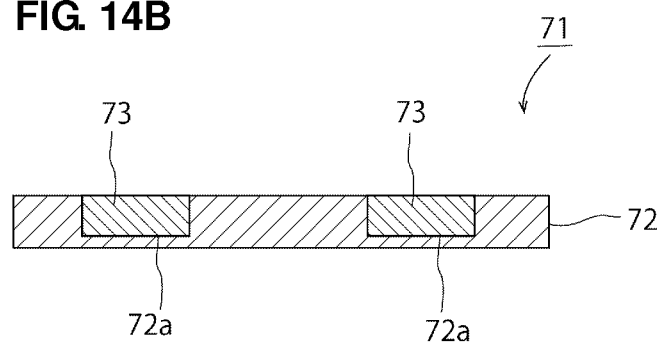
FIG. 14B is a front sectional view of the composite target shown in FIG. 14A.

The following film can be formed by another method: a piezoelectric thin film including an Sc-containing aluminum nitride layer having a concentration distribution such that the concentration of Sc is non-uniform in a thickness direction thereof. This piezoelectric thin film may preferably be formed by a sputtering process using, for example, a composite target 71 shown in FIGS. 14A and 14B. The composite target 71 includes a target body 72. The target body 72 includes an Al plate. The upper surface of the target body 72 includes a plurality of recessed portions 72a. The recessed portions 72a are located along an erosion region E. The recessed portions 72a are each filled with an Sc target portion 73. In particular, in the upper surface of the target body 72, which is substantially disk-shaped, the Sc target portions 73 are uniformly distributed and arranged along the erosion region E, which is substantially ring-shaped, in the circumferential direction of the erosion region E.

The Sc-containing aluminum nitride layer, which has a concentration distribution such that the concentration of Sc varies in a thickness direction thereof, that is, which has an Sc concentration distribution, can be readily obtained in such a manner that the composite target 71, which has the recessed portions 72a filled with the Sc target portions 73, is sputtered in an atmosphere containing at least a nitrogen gas.

Figure 14C:
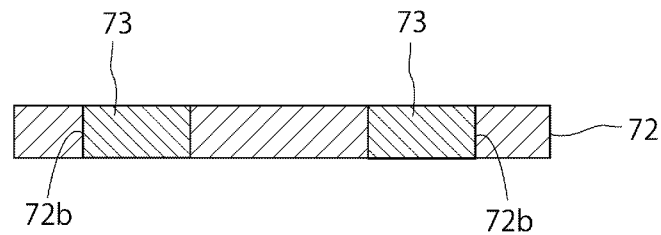
FIG. 14C is a front sectional view of another composite target.

Substantially the same effect as described above can be obtained using a target including a target body 72 which is made of Al and which has perforations 72b filled with Sc target portions 73 as shown in FIG. 14C.

Figure 15A:
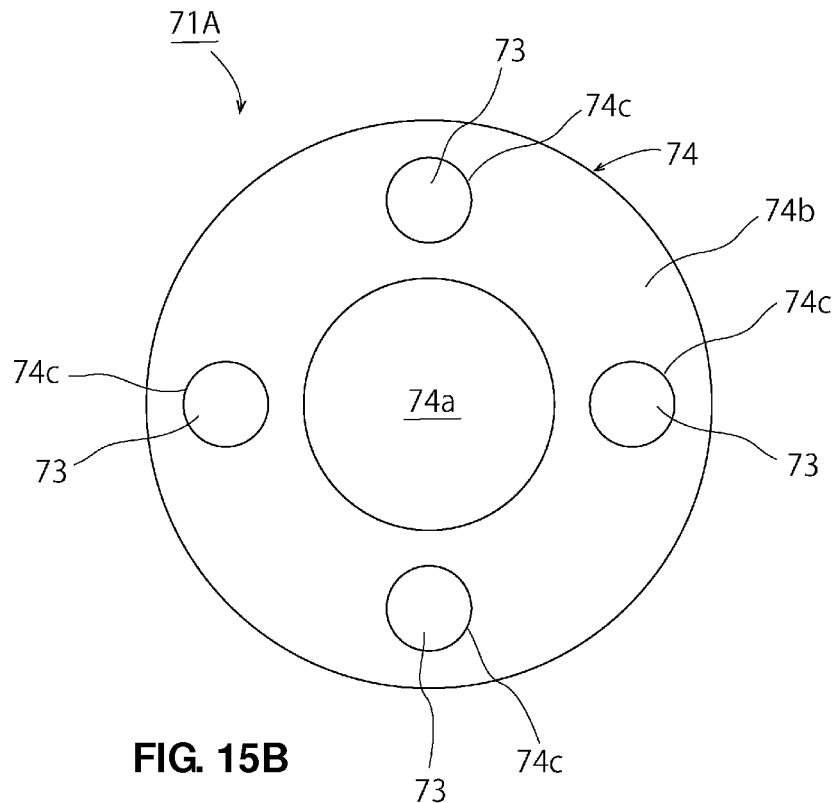
FIG. 15A is a plan view of a composite target used in a method for producing a piezoelectric thin film according to another preferred embodiment of the present invention.
Figure 15B:
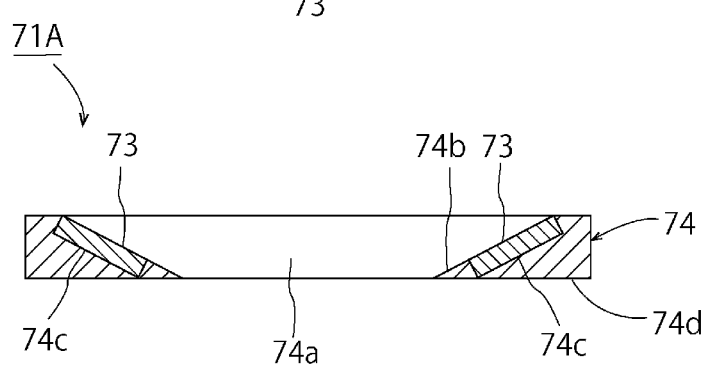
FIG. 15B is a front sectional view of the composite target shown in FIG. 15A.

Alternatively, a target body 74 shown in FIGS. 15A and 15B may be used. The target body 74 is substantially ring-shaped and is made of Al. The target body 74 includes a centered opening 74a and substantially a ring shape. The target body 74 includes an upper surface 74b which is substantially a ring-shaped slope that slopes downward toward the outer edge. The upper surface 74b, which is such a ring-shaped slope, includes a plurality of recessed portions 74c which are circumferentially arranged. The recessed portions 74c are each filled with an Sc target portion 73. The target body 74 includes a lower surface 74d which is substantially flat.

The upper surface 74b of the target body 74 is the ring-shaped slope, in which the Sc target portions 73 are embedded. In the case of using the composite target 71A, the Sc-containing aluminum nitride layer, which has such a concentration distribution that the concentration of Sc varies in a thickness direction thereof, can be readily obtained in such a manner that the composite target 71A is sputtered in an atmosphere containing at least a nitrogen gas.

In the target body 72 or 74, the Sc target portions 73 are preferably arranged along the erosion region E. This is because the erosion region E has a high sputtering yield and therefore Sc, which is relatively expensive, can be efficiently sputtered. The position of each of the Sc target portions 73 is not particularly limited.

The Sc-containing aluminum nitride layer has a larger dielectric loss and a larger electromechanical coefficient as compared to aluminum nitride layers. The Sc-containing aluminum nitride layer has a narrower bandgap and lower dielectric strength voltage as compared to the aluminum nitride layers. The crystallinity of the Sc-containing aluminum nitride layer is more likely to be reduced as compared to that of the aluminum nitride layers. The half-value width of the rocking curve of the Sc-containing aluminum nitride layer is wider than that of the aluminum nitride layers. The Sc-containing aluminum nitride layer is more unlikely to be etched with an alkali solution as compared to the aluminum nitride layers.

Accordingly, the above features of the Sc-containing aluminum nitride layer can be exhibited by varying the concentration of Sc in a thickness direction of each of the piezoelectric thin films 6 and 6A, whereby piezoelectric thin-film resonators having various properties can be obtained and the degree of freedom in designing a piezoelectric thin-film resonator can be greatly increased.

Third Preferred Embodiment

Figure 7:
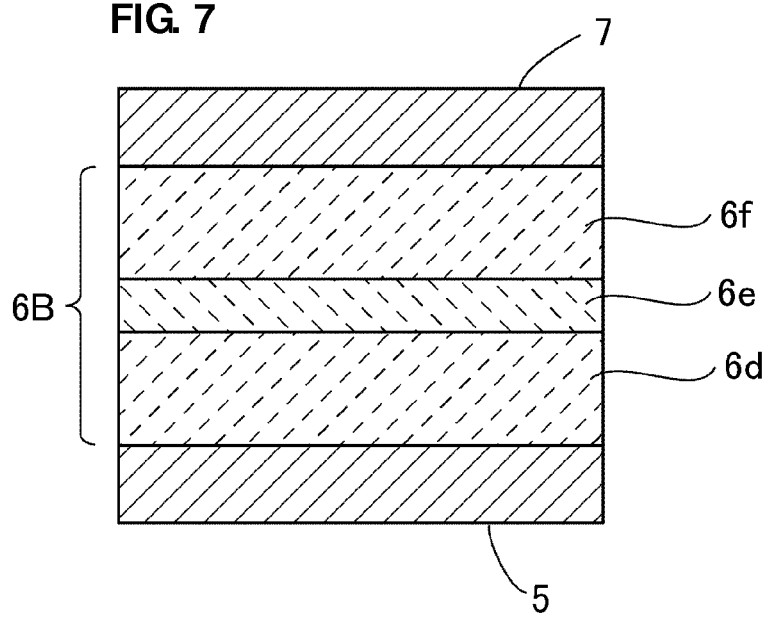
FIG. 7 is an enlarged front sectional view of a structure in which a piezoelectric thin film, a first electrode, and a second electrode included in a piezoelectric thin-film resonator according to a third preferred embodiment of the present invention are stacked.

FIG. 7 is an enlarged front sectional view of a principal portion of a region in which a piezoelectric thin film 6B, a first electrode 5, and a second electrode 7 included in a piezoelectric thin-film resonator according to a third preferred embodiment of the present invention are stacked.

Components, other than the piezoelectric thin film 6B, used in the present preferred embodiment as well as the second preferred embodiment preferably are substantially the same as those described in the first preferred embodiment. Therefore, descriptions made with reference to FIG. 1A are incorporated herein and these components will not be described.

With reference to FIG. 7, the first and second electrodes 5 and 7 face each other across the piezoelectric thin film 6B. The piezoelectric thin film 6B includes a first Sc-containing aluminum nitride layer 6d, an aluminum nitride layer 6e, and a second Sc-containing aluminum nitride layer 6f stacked in that order. That is, in contrast to the first preferred embodiment, the aluminum nitride layer 6e is located at an approximate center of the piezoelectric thin film 6B in a thickness direction thereof and the first and second Sc-containing aluminum nitride layer 6d and 6f are located on both sides of the aluminum nitride layer 6e. Therefore, the concentration of Sc is lowest at the approximate center of the piezoelectric thin film 6B in the thickness direction thereof and is high on the sides of the first and second electrodes 5 and 7.

Figure 8:
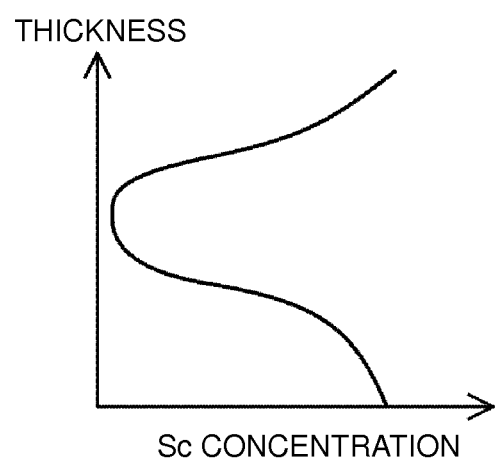
FIG. 8 is a graph showing the concentration distribution of Sc in a thickness direction of a piezoelectric thin film of a piezoelectric thin-film resonator according to a modification of the third preferred embodiment of the present invention.

In the present preferred embodiment, the piezoelectric thin film 6B preferably includes stacked layers. The piezoelectric thin film 6B may be one in which the concentration of Sc varies continuously in a thickness direction thereof as described in the second preferred embodiment. FIG. 8 shows the concentration distribution in a modification of the present preferred embodiment. The modification may have a structure in which the concentration of Sc is lowest at the approximate center of the piezoelectric thin film in the thickness direction thereof and increases gradually toward both sides of the piezoelectric thin film.

Sc-containing aluminum nitride has a higher resistance to etching with an alkali developer as compared to aluminum nitride. In the present preferred embodiment and the modification thereof, which has the concentration distribution shown in FIG. 8, the upper surface of the piezoelectric thin film 6B is exposed to an alkali developer in the case of forming the second electrode 7 by, for example, a lift-off process. In the present preferred embodiment and the modification thereof, a portion located on the second electrode 7 side has a high Sc concentration or includes the second Sc-containing aluminum nitride layer 6f; hence, this portion is excellent in etching resistance. That is, a resist pattern need not be formed by a special process other than alkali developing. Furthermore, any protective film against an alkali developer need not be formed on the upper surface of the piezoelectric thin film 6B.

In addition, the second Sc-containing aluminum nitride layer 6f and aluminum nitride having a high Sc concentration are excellent in etching resistance and therefore the second electrode 7 and the like can be formed using an ordinary alkali developer.

In a method for removing a sacrificial layer made of an organic resist to form the cavity A shown in FIG. 1A as described above, aluminum nitride may possibly be dissolved in an alkaline etchant used to etch the sacrificial layer. However, in the present preferred embodiment and the modification thereof, the lower portion of the piezoelectric thin film 6B has a high Sc content and therefore is excellent in etching resistance; hence, the piezoelectric thin film 6B is hardly damaged by etching for forming the sacrificial layer. Thus, the piezoelectric thin-film resonator can be provided so as to exhibit good piezoelectric properties.

Fourth Preferred Embodiment

Figure 9:
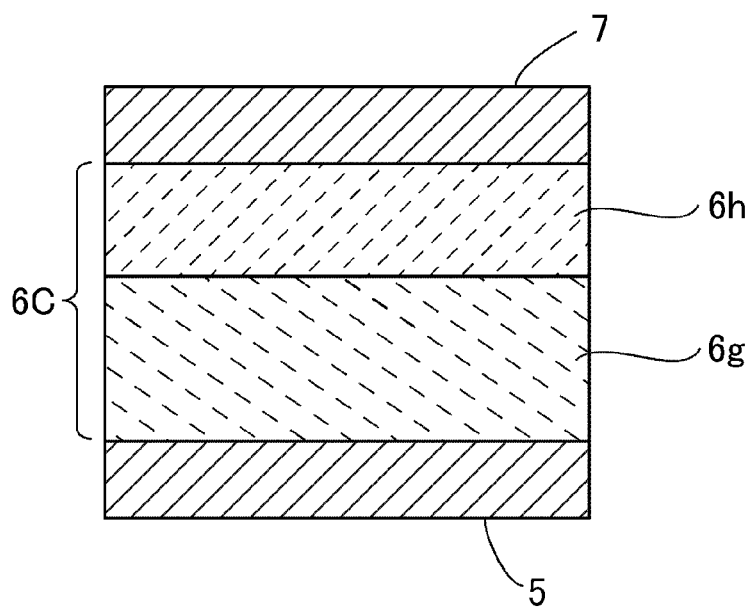
FIG. 9 is an enlarged front sectional view of a structure in which a piezoelectric thin film, a first electrode, and a second electrode included in a piezoelectric thin-film resonator according to a fourth preferred embodiment of the present invention are stacked.

FIG. 9 is an enlarged front sectional view of a structure in which a piezoelectric thin film 6C, a first electrode 5, and a second electrode 7 included in a piezoelectric thin-film resonator according to a fourth preferred embodiment of the present invention are stacked. In the present preferred embodiment, the first and second electrodes 5 and 7 face each other across the piezoelectric thin film 6C. The piezoelectric thin film 6C has a structure in which an aluminum nitride layer 6h is stacked on an Sc-containing aluminum nitride layer 6g.

In the present preferred embodiment, the aluminum nitride layer 6h has good crystallinity and is located on the Sc-containing aluminum nitride layer 6g. The second electrode 7 defines an upper electrode and is located on the aluminum nitride layer 6h. This allows the second electrode 7 to have increased crystallinity and increased power durability.

Figure 10A:
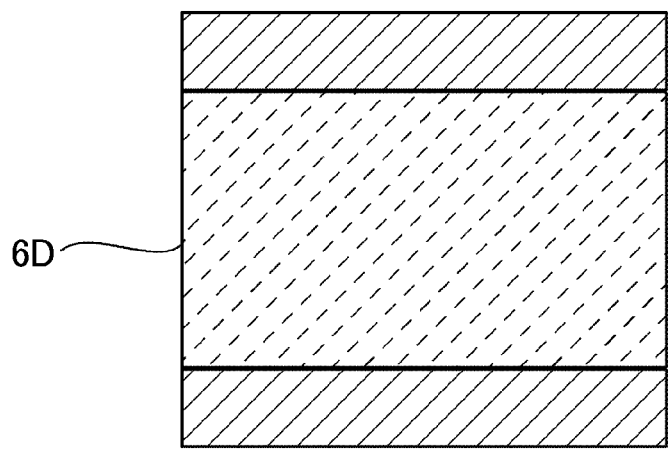
FIG. 10A is an enlarged front sectional view of a principal portion of a region in which a piezoelectric thin film, a first electrode, and a second electrode included in a piezoelectric thin-film resonator according to a modification of the fourth preferred embodiment of the present invention are stacked.
Figure 10B:
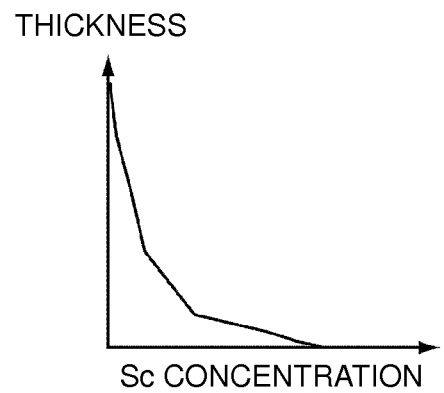
FIG. 10B is a graph illustrating the concentration distribution of Sc in a thickness direction of the piezoelectric thin film of the piezoelectric thin-film resonator according to the modification of the fourth preferred embodiment of the present invention.

FIG. 10A is a front sectional view of a portion in which a piezoelectric thin film 6D, a first electrode, and a second electrode included in a piezoelectric thin-film resonator according to a modification of the fourth preferred embodiment are stacked. In the modification, the concentration of Sc in the piezoelectric thin film 6D varies continuously in a thickness direction thereof. FIG. 10B shows the concentration distribution. With reference to FIG. 10B, the concentration of Sc increases from the upper surface toward the lower surface of the piezoelectric thin film 6D. Thus, in the modification as well as the fourth preferred embodiment, in which the piezoelectric thin film 6C is used, the crystallinity and power durability of the second electrode 7, which serves as an upper electrode, can be increased.

In this preferred embodiment, the aluminum nitride layer 6h is preferably located on the Sc-containing aluminum nitride layer 6g. On the contrary, the Sc-containing aluminum nitride layer 6g may be located on the aluminum nitride layer 6h.

That is, the Sc-containing aluminum nitride layer 6g may be located on the second electrode 7 side.

Fifth Preferred Embodiment

Figure 11:
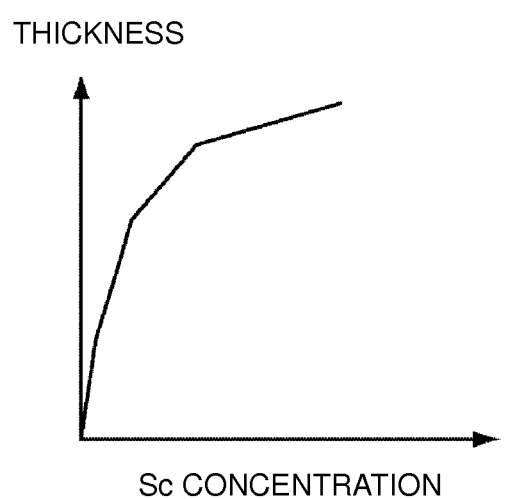
FIG. 11 is a graph illustrating the concentration distribution of Sc in a thickness direction of a piezoelectric thin film included in a piezoelectric thin-film resonator according to a modification of a fifth preferred embodiment of the present invention.

A fifth preferred embodiment of the present invention provides a piezoelectric thin-film resonator including a piezoelectric thin film having a structure in which the order of stacked layers is opposite to that shown in FIG. 9. A modification of the present preferred embodiment provides a piezoelectric thin-film resonator including a piezoelectric thin film having an Sc concentration distribution shown in FIG. 11. That is, the following film may be used: contrary to the structure shown in FIG. 10B, a piezoelectric thin film in which the concentration of Sc gradually decreases from the upper surface toward the lower surface thereof.

In the piezoelectric thin-film resonator according to the fifth preferred embodiment or the modification thereof, an aluminum nitride layer or an aluminum nitride region having an extremely low Sc concentration is located on the side of a first electrode 5. An Sc-containing aluminum nitride layer or an aluminum nitride region having a high Sc concentration is preferably located on the aluminum nitride layer or the low-Sc concentration aluminum nitride region and therefore an aluminum nitride layer or an aluminum nitride region having a low Sc concentration having good crystallinity is grown or formed on the first electrode 5. Thus, the crystallinity of the Sc-containing aluminum nitride layer or the high-Sc concentration aluminum nitride region can be increased.

Sixth Preferred Embodiment

Figure 12:
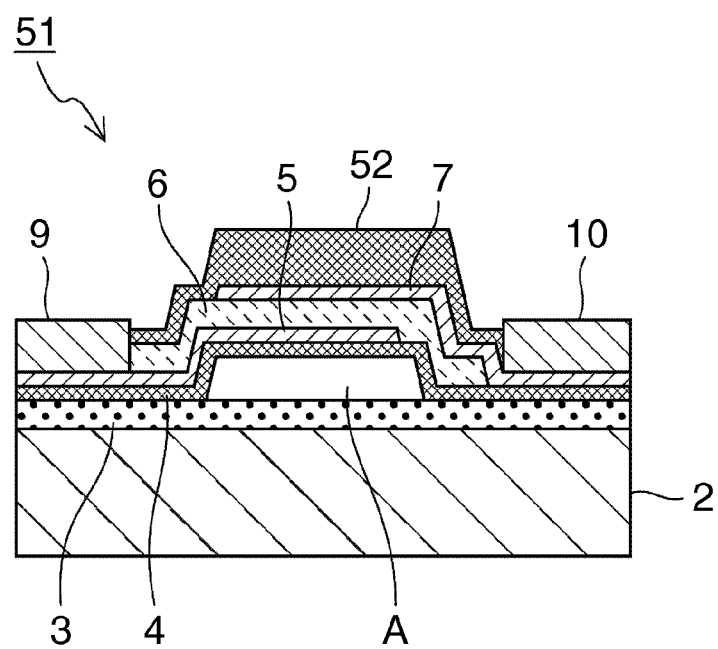
FIG. 12 is a front sectional view of a piezoelectric thin-film resonator according to a sixth preferred embodiment of the present invention.

FIG. 12 shows a piezoelectric thin-film resonator 51 according to a sixth preferred embodiment of the present invention. Although the fundamental of a piezoelectric bulk wave is used in the above-described preferred embodiments and modifications thereof, a configuration in which the second harmonic of a piezoelectric bulk wave may be used in the above-described preferred embodiments and modifications thereof, such as the piezoelectric thin-film resonator 51. The piezoelectric thin-film resonator 51 includes a second electrode 7 and a silicon oxide film 52 which is located on the upper surface of the second electrode 7 and which is thick. Other structures of the piezoelectric thin-film resonator 51 preferably are substantially the same as those of the piezoelectric thin-film resonator 1 according to the first preferred embodiment. Since the thick silicon oxide film 52 is located on the second electrode 7, the second harmonic of a piezoelectric bulk wave can be used by making use of the mass loading effect and others of the thick silicon oxide film 52.

The polarity of the temperature coefficient of elastic constant of silicon oxide is opposite to the polarity of the temperature coefficient of elastic constant of aluminum nitride. Therefore, the piezoelectric thin-film resonator 51, which includes the thick silicon oxide film 52, has better frequency-temperature properties as compared to the piezoelectric thin-film resonator 1, in which the fundamental wave is used, according to the first preferred embodiment. That is, the absolute value of the temperature coefficient of frequency TCF of the piezoelectric thin-film resonator 51 is small.

Seventh Preferred Embodiment

Figure 13:
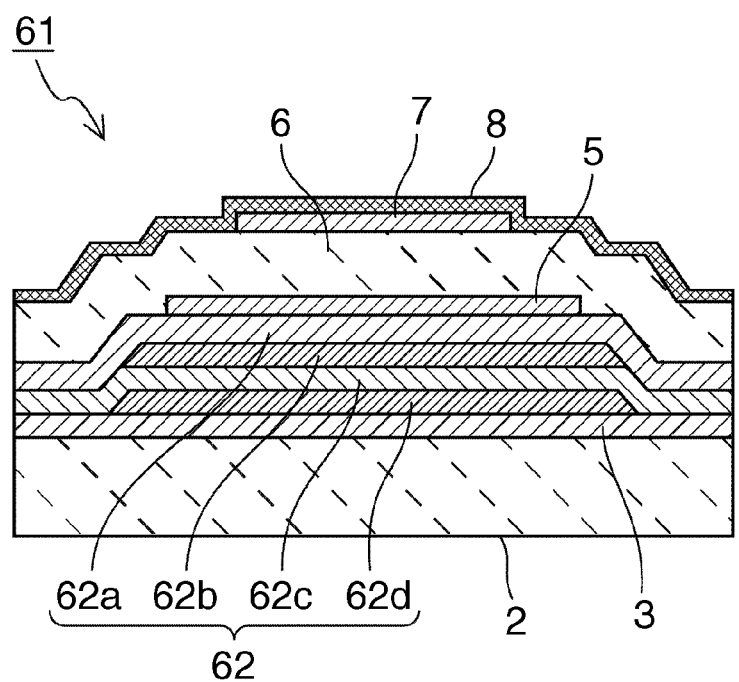
FIG. 13 is a front sectional view of a piezoelectric thin-film resonator according to a seventh preferred embodiment of the present invention.

FIG. 13 is a schematic front sectional view of a piezoelectric thin-film resonator 61 according to a seventh preferred embodiment of the present invention.

The piezoelectric thin-film resonator 61 has no cavity A and includes a first electrode 5, a substrate 2, and an acoustic reflecting layer 62 located therebetween. The acoustic reflecting layer 62 has a structure in which relatively high-acoustic impedance sub-layers 62a and 62c and relatively low-acoustic impedance sub-layers 62b and 62d are alternately stacked. In a known piezoelectric thin-film resonator including the acoustic reflecting layer 62, sufficient bandwidth can be ensured and frequency-temperature properties can be improved by making a piezoelectric thin film from Sc-containing aluminum nitride as described in the first preferred embodiment.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric thin-film resonator comprising:
a piezoelectric thin film which includes aluminum nitride containing Sc and which has a concentration distribution such that a concentration of Sc is non-uniform in a thickness direction of the piezoelectric thin film;
a first electrode;
a second electrode facing the first electrode across the piezoelectric thin film; and
a substrate supporting a piezoelectric vibrating section defined by the piezoelectric thin film and the first and second electrodes; wherein
the piezoelectric thin film is a multilayer film including a plurality of stacked layers having different Sc concentrations; and
the plurality of stacked layers include an Sc-free aluminum nitride layer and an Sc-containing aluminum nitride layer.

2. The piezoelectric thin-film resonator according to claim 1, wherein the piezoelectric thin film includes side portions which are each in contact with a corresponding one of the first and second electrodes and an approximate center of the piezoelectric thin film in the thickness direction thereof has an Sc concentration higher than that of the side portions.

3. A piezoelectric thin-film resonator comprising:
a piezoelectric thin film which includes aluminum nitride containing Sc and which has a concentration distribution such that a concentration of Sc is non-uniform in a thickness direction of the piezoelectric thin film;
a first electrode;
a second electrode facing the first electrode across the piezoelectric thin film; and
a substrate supporting a piezoelectric vibrating section defined by the piezoelectric thin film and the first and second electrodes; wherein
the concentration of Sc in the piezoelectric thin film varies continuously in the thickness direction thereof; and
the piezoelectric thin film includes side portions which are each in contact with a corresponding one of the first and second electrodes and an approximate center of the piezoelectric thin film in the thickness direction thereof has an Sc concentration higher than that of the side portions.

4. The piezoelectric thin-film resonator according to claim 3, wherein the first electrode defines a lower electrode, the second electrode defines an upper electrode, and the piezoelectric thin film includes a surface portion which is in contact with the upper electrode and which includes aluminum nitride containing no Sc.

5. The piezoelectric thin-film resonator according to claim 1, wherein the piezoelectric thin film includes side portions which are each in contact with a corresponding one of the first and second electrodes and an approximate center of the piezoelectric thin film in the thickness direction thereof has an Sc concentration lower than that of the side portions.

6. A piezoelectric thin-film resonator comprising:
a piezoelectric thin film which includes aluminum nitride containing Sc and which has a concentration distribution such that a concentration of Sc is non-uniform in a thickness direction of the piezoelectric thin film;
a first electrode;
a second electrode facing the first electrode across the piezoelectric thin film; and
a substrate supporting a piezoelectric vibrating section defined by the piezoelectric thin film and the first and second electrodes; wherein
the concentration of Sc in the piezoelectric thin film varies continuously in the thickness direction thereof; and
the piezoelectric thin film includes side portions which are each in contact with a corresponding one of the first and second electrodes and an approximate center of the piezoelectric thin film in the thickness direction thereof has an Sc concentration lower than that of the side portions.

7. The piezoelectric thin-film resonator according to claim 1, wherein one of the layers that is in contact with the first electrode and one of the layers that is in contact with the second electrode are Sc-containing aluminum nitride layers and one of the layers that is located at the approximate center of the piezoelectric thin film in the thickness direction thereof is an Sc-free aluminum nitride layer.

8. The piezoelectric thin-film resonator according to claim 1, wherein the concentration of Sc in the piezoelectric thin film ranges from about 0.5 atomic percent to about 24 atomic percent.

9. The piezoelectric thin-film resonator according to claim 3, wherein the concentration of Sc in the piezoelectric thin film ranges from about 0.5 atomic percent to about 24 atomic percent.

10. The piezoelectric thin-film resonator according to claim 6, wherein the concentration of Sc in the piezoelectric thin film ranges from about 0.5 atomic percent to about 24 atomic percent.

* * * * *